US010755020B1

(12) United States Patent
Hernandez Mojica et al.

(10) Patent No.: US 10,755,020 B1
(45) Date of Patent: Aug. 25, 2020

(54) THERMAL ARRANGEMENT OF MODULES IN SERVER ASSEMBLIES

(71) Applicant: Microsoft Technology Licensing, LLC, Redmond, WA (US)

(72) Inventors: Andres Felipe Hernandez Mojica, Seattle, WA (US); William Paul Hovis, Sammamish, WA (US); Garrett Douglas Blankenburg, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/373,703

(22) Filed: Apr. 3, 2019

(51) Int. Cl.
| | | |
|---|---|---|
| G06F 17/50 | (2006.01) | |
| G06F 1/00 | (2006.01) | |
| G06F 9/44 | (2018.01) | |
| G06F 13/10 | (2006.01) | |
| G06F 13/12 | (2006.01) | |
| G06F 30/392 | (2020.01) | |
| G06F 11/30 | (2006.01) | |
| G06F 30/3308 | (2020.01) | |
| G06F 30/337 | (2020.01) | |
| G06F 30/398 | (2020.01) | |

(52) U.S. Cl.
CPC ............. *G06F 30/392* (2020.01); *G06F 1/00* (2013.01); *G06F 9/44* (2013.01); *G06F 11/30* (2013.01); *G06F 13/10* (2013.01); *G06F 13/12* (2013.01); *G06F 30/337* (2020.01); *G06F 30/3308* (2020.01); *G06F 30/398* (2020.01)

(58) Field of Classification Search
CPC .. G06F 30/392; G06F 30/3308; G06F 30/337; G06F 30/398; G06F 1/00; G06F 11/30; G06F 9/44; G06F 13/10; G06F 13/12; G01R 21/00; G01R 21/06; G01R 31/00; G01R 31/14; G06G 7/62; G06G 7/54; H05K 1/02; H02J 1/00; H02J 3/14
USPC .... 716/119, 120, 122, 133, 136; 703/16, 17, 703/18, 20; 702/60, 118; 713/330, 340; 307/31, 39, 42
See application file for complete search history.

(56) References Cited

U.S. PATENT DOCUMENTS

| | | | | |
|---|---|---|---|---|
| 5,905,901 A | * | 5/1999 | Klein ................... | G06F 1/3203 713/324 |
| 5,941,989 A | * | 8/1999 | Klein ...................... | G06F 1/26 340/550 |

(Continued)

*Primary Examiner* — Phallaka Kik

(57) ABSTRACT

Computing assemblies, such as blade servers, can comprise a plurality of modular computing elements coupled onto an associated circuit board assembly. Assemblies and systems having enhanced individual computing module placement and arrangement are discussed herein, as well as example systems and operations to manufacture such assemblies. In one example, a method includes executing a performance test on a plurality of computing modules to determine at least variability in power consumption across the plurality of computing modules, and binning the plurality of computing modules according to graduated levels of the variability in power consumption. The method also includes selecting from among the graduated levels for placement in an assembly of ones of the computing modules in a progressively lower power consumption arrangement with relation to an airflow of the assembly.

20 Claims, 7 Drawing Sheets

(56) References Cited

U.S. PATENT DOCUMENTS

| | | | | |
|---|---|---|---|---|
| 6,898,417 B1* | 5/2005 | Moulsley | H04W 52/18 | 455/69 |
| 2011/0049984 A1* | 3/2011 | Son | H02J 3/14 | 307/31 |
| 2011/0050618 A1* | 3/2011 | Murphy | G06F 1/3215 | 345/174 |
| 2011/0318044 A1* | 12/2011 | Matsumoto | G03G 15/5004 | 399/88 |
| 2012/0105516 A1* | 5/2012 | Shoji | G09G 3/2932 | 345/691 |
| 2014/0372777 A1* | 12/2014 | Reller | G06F 1/3253 | 713/320 |
| 2015/0039922 A1* | 2/2015 | Chalhoub | G06F 1/3234 | 713/323 |
| 2015/0194083 A1* | 7/2015 | Sinha | G09G 3/007 | 345/212 |
| 2016/0055271 A1* | 2/2016 | Fukuzawa | G06F 30/327 | 716/104 |
| 2019/0190266 A1* | 6/2019 | Soulieres | H02J 3/06 | |

* cited by examiner

THERMAL ARRANGEMENT OF MODULES IN SERVER ASSEMBLIES

BACKGROUND

Networked storage and computing systems have been introduced which store and process large amounts of data in enterprise-class storage environments. Networked storage systems typically provide access to bulk data storage, while networked computing systems provide remote access to shared computing resources. These networked storage systems and remote computing systems can be included in high-density installations, such as rack-mounted environments. Various computing and storage solutions have been offered using large installations of high-density rack-mount equipment. In some instances, collections of integrated circuits, such as processor devices and peripheral circuitry employed in computing systems, can be integrated into modular equipment, referred to as blade servers. These blade servers are compact modular computing equipment that include a chassis and enclosure, as well as various cooling or airflow equipment. A large collection of the modular blade servers can be included in each rack of a rack-mount environment, to provide for multiple instances of similar hardware with a low physical footprint. However, power consumption in these high-density configurations can create waste heat and other undesired effects for integrated components. When these components rise in temperature, associated efficiencies and reliability can be reduced, and failures can result. Many times, oversized cooling components, such as large active cooling systems and heatsinks, are included to attempt to reduce the effects of temperature rise, which can lead to increased cost, size, weight, and complexity, as well as lower equipment densities within racks.

OVERVIEW

Computing assemblies, such as blade servers, can comprise a plurality of modular computing elements coupled onto an associated circuit board assembly. Assemblies and systems having enhanced individual computing module placement and arrangement are discussed herein, as well as example systems and operations to manufacture such assemblies. In one example, a method includes executing a performance test on a plurality of computing modules to determine at least variability in power consumption across the plurality of computing modules, and binning the plurality of computing modules according to graduated levels of the variability in power consumption. The method also includes selecting from among the graduated levels for placement in an assembly of ones of the computing modules in a progressively lower power consumption arrangement with relation to an airflow of the assembly.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Networked computing systems can store and service large amounts of data or applications in high-density computing environments. Rack-mounted environments are typically employed, which includes standardizes sizing and modularity among individual rack units. For example, a 19" rack mount system might include a vertical cabinet arrangement having a vertical height sufficient for 42 "unit" (U) sized modules coupled to an integrated rail mounting system. Other sizes and configurations of rack mount systems can be employed. Various computing and storage solutions have been offered using large installations of these high-density rack-mount equipment. In some instances, individual computing units can be referred to as blade servers, which typically each comprise a computer/processor element along with network elements, storage elements, and other peripheral circuitry. These blade servers are compact modular computing equipment that include a chassis and enclosure, as well as various cooling or airflow equipment. A large collection of blade servers can be included in each rack of a rack-mount environment, to provide for multiple instances of similar hardware with a low physical footprint. However, power consumption in these high-density configurations can create waste heat and other undesired effects for integrated components.

In the examples discussed herein, enhanced configurations and arrangements of components within blade servers or any other rack-mounted equipment are provided. Subassemblies which comprise the blade servers can be optimized for power, cooling, and thermal considerations. In one example system, an assembly includes a plurality of modular computing elements which are placed onto a common circuit board or set of circuitry boards within an enclosure. Each of these computing modules might comprise an individual computer system capable of executing an operating system and applications, and interfacing over network-based links with one or more end users. In a specific example, these computing modules might each comprise an integrated gaming system, such as an Xbox gaming system, formed into a single modular assembly. The individual modular assemblies can have system processors, such as system-on-a-chip (SoC) elements with processing cores and graphics cores, along with associated memory, storage, network interfaces, voltage regulation circuitry, and peripheral devices. Several of these gaming systems can be assembled into a blade server and packaged into an enclosure with one or more fan units. In the examples below, eight (8) of these computing modules (having associated circuit boards) are assembled into a single 2U blade assembly. Then, multiple ones of these 2U blade arrangements can be coupled into a rack. As many as 40-48 rack units thus can hold 20-24 2U blade assemblies.

Figure 1:
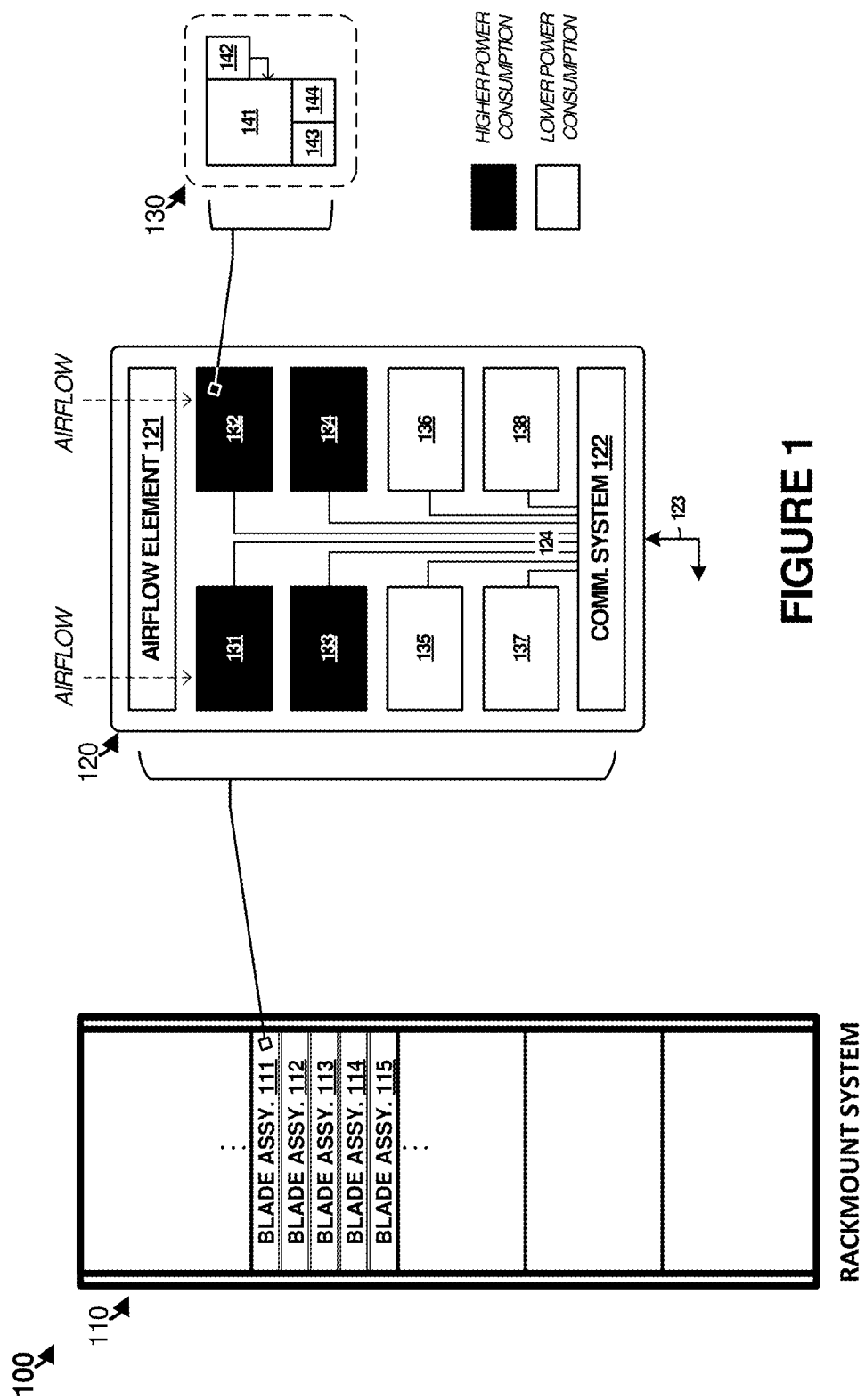
FIG. 1 illustrates a computing environment in an implementation.

Turning now to a first example configuration, FIG. 1 is presented. FIG. 1 illustrates computing environment 100. Computing environment 100 includes rackmount system 110 having a plurality of blade assemblies 111-115 coupled therein. Although the examples herein do not require installation into a rackmount system, environment 100 includes rackmount system 110 for context and clarity. Each blade assembly 111-115 can comprise example blade assembly 120 which include eight (8) computing modules 131-138. An example computing module 130 is also shown in FIG. 1. It should be understood that a different quantity of computing modules can be included.

As mentioned above, blade assembly 120 include computing modules 131-138. Blade assembly 120 also include airflow element 121, communication system 122, and communication links 124. Each blade assembly 111-115 might communicate with external systems over an associated network link 123, which may include one or more individual links. Furthermore, blade assembly 120 can include power elements, such as power filtering and distribution elements to provide each of computing modules 131-138 with input power. Blade assembly 120 can be coupled to a single circuit board or may comprise a circuit board assembly having one or more circuit boards, chassis elements, connectors, and other elements. In one configuration, blade assembly 120 include connectors to individually couple to computing modules 131-138, as well as mounting elements to fasten computing modules 131-138 to a structure, circuit board, or chassis. Blade assembly 120 can be included in an enclosure or case which surrounds the various elements of blade assembly 120 and provides one or more channels for airflow provided by airflow element 121.

Figure 6:
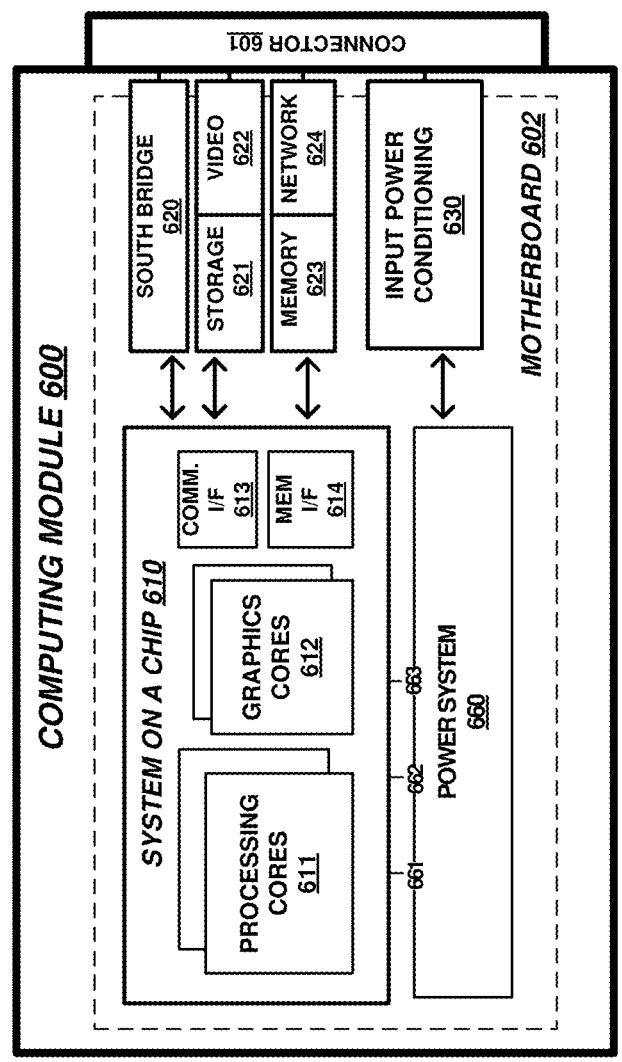
FIG. 6 illustrates an example computing module in an implementation.

Example computing module 130 is shown having various elements 141-144. In FIG. 1, element 141 comprises a system processor, such as a CPU, GPU, or an SoC device, element 142 comprises a power system including voltage regulation circuitry, element 143 comprises one or more network interfaces including network interface card (NIC) circuitry, and element 144 comprises various peripheral elements and circuitry. Each of computing modules 131-138 is typically the same type of module or uniform type of module. Some of computing modules 131-138 might comprise similar types of modules comprising functionally compatible components, such as when updates or upgrades are made to individual computing modules over time. Thus, any of computing modules 131-138 can be swapped for each other and failed ones among computing modules 131-138 can be replaced with a common type of module which couples using a common type of connector. A further detailed example of computing module 130 is shown in FIG. 6, although variations are possible.

Airflow element 121 comprises one or more fans, fan assembles, fan elements, or other devices to produce an airflow over blade assembly 120 for removal of waste heat from at least computing modules 131-138. Airflow element 121 can comprise any fan type, such as axial-flow, centrifugal and cross-flow, or other fan types, including associated ducts, louvers, fins, or other directional elements, including combinations and variations thereof. Airflow provided by airflow element 121 can move through one or more perforations or vents in an associated enclosure that houses blade assembly 120. Airflow provided by airflow element 121 also has a directionality, with an upstream direction and downstream direction with relation to computing modules 131-138. In examples where airflow element 121 pushes air over computing modules 131-138, airflow element 121 will draw cooler air into an enclosure and push the cooler air over computing modules 131-132 before other computing modules. In examples where airflow element 121 pulls air over computing modules 131-138, airflow element 121 will draw cooler air into an enclosure and over computing modules with relatively higher power consumption properties before other computing modules with relatively lower power consumption properties.

In operation, power consumption by computing modules 131-138 can have a substantial power budget allocated to system processor 141. Thus, power consumption levels in computing modules 131-138 tend to increase as performance requirements increase. Power supply components 142 are included in computing modules 131-138 to convert voltage levels from input sources as well as manage power distribution to the individual integrated circuits. Computing modules 131-138 can also include more than one voltage domain that segregates power consumption among particular integrated circuits or portions of the same integrated circuits, such as for processing cores or graphics cores each having corresponding supply voltage requirements.

The various examples and implementations described herein advantageously provide for lower power consumption in processing devices and associated computing systems without altering performance levels of the processing devices and associated computing systems. Voltage reduction techniques are discussed for computing systems and processing devices to determine reduced operating voltages below manufacturer-specified voltages. These reduced operating voltages can lead to associated reductions in power consumption. Also, techniques and implementations illustrate various ways to employ these reduced operating voltages once determined, such as in systems having multiple computing modules assembled into a blade server arrangement with a shared fan assembly.

The voltage adjustment techniques herein exercise a system processor device, such as an SoC device, in the context of various system components of a computing assembly. These system components can include memory elements (such as random access memory or cache memory), data storage elements (such as mass storage devices), communication interface elements, peripheral devices, and power electronics elements (such as voltage regulation or electrical conversion circuitry), among others, exercised during functional testing of the processing device. Moreover, the voltage adjustment techniques herein operationally exercise internal components or portions of a processing devices, such as processing core elements, graphics core elements, north bridge elements, input/output elements, or other integrated features of the processing device.

During manufacture of processing devices, a manufacturing test can adjust various voltage settings for a manufacturer-specified operating voltage for the various associated voltage domains or voltage rails of the processing device. When placed into a computing apparatus, such as a computer, server, gaming system, or other computing device, voltage regulation elements use these manufacturer-specified operating voltages to provide appropriate input voltages to the processing device. Voltage tables can be employed that relate portions of the processing device to manufacturer-specified operating voltages as well as to specific clock frequencies for those portions. Thus, a hard-coded frequency/voltage (F/V) table is employed in many processing devices which might be set via fused elements to indicate to support circuitry preferred voltages for different voltage domains and operating frequencies. In some examples, these fused elements comprise voltage identifiers (VIDs) which indicate a normalized representation of the manufacturer-specified operating voltages.

Built-in system test (BIST) circuitry can be employed to test portions of a processing device, but this BIST circuitry typically only activates a small portion of a processing device and only via dedicated and predetermined test pathways. Although BIST circuitry can test for correctness/validation of the manufacture a processing device, BIST circuitry often fails to capture manufacturing variation between devices that still meets BIST thresholds. Manufacturing variations from device to device include variations in metal width, metal thickness, insulating material thickness between metal layers, contact and via resistance, or variations in transistor electrical characteristics across multiple transistor types, and all variations can have impacts on the actual results of power consumption in functional operation. Not only do these structures vary from processing device to processing device, but they vary within a processing device based on normal process variation and photolithography differences that account for even subtle attribute differences in all these structures. As a result, the reduced operating voltages can vary and indeed may be unique on each processing device. BIST also typically produces a pass/fail result at a specific test condition. This test condition is often substantially different from real system operation for performance (and power) such that it does not accurately represent system power and performance capability of the device. With large amounts of variability between a BIST result and a functional result, the voltages employed by BIST may be found sufficient for operation but might employ significant amounts of voltage margin. In contrast to BIST testing, the functional tests described herein employ functional patterns that activate not only the entire processing device but also other components of the contextually-surrounding system that may share power domains or other elements with the processing device.

In the examples herein, functional tests are employed to determine reduced operating voltages (Vmins) for a system processor, such as SoC devices, graphics processing units (GPUs), or central processing units (CPUs). These functional tests run system-level programs which test not only a processing device, but the entire computing module in which the processing device is installed. Targeted applications can be employed which exercise the computing module and the processing device to ensure that particular processing units within the processing device are properly activated. This can include ensuring that all portions of the processing device are activated fully, a subset of units activated fully, or specific sets of background operations active in combination with targeted power-consuming operations.

In a specific example, such as that shown example computing module 130 in FIG. 1, system processor 141 is employed. The system processor can comprise a CPU with one or more processing cores, a GPU with one or more graphics cores, a north bridge which handles communication between various cores, integrated memory, and off-processor memory. Input/output portions are also included in the system processor to allow for communication with universal serial bus (USB) ports, peripheral component interconnect express (PCIe) links, mass storage interfaces, networking interfaces such as Ethernet or wireless networking, user interface devices, game controllers, and other devices communicatively coupled to the system processor. Multiple power domains can be employed in the system processor, such as a first one for the processing cores, a second one for the north bridge, and a third one for the graphics cores, among others. Each of these cores can be functionally tested in parallel to ensure traffic propagation and logical activation across core boundaries comprising both clock and voltage boundaries.

The functional tests for CPU portions can include operations initiated simultaneously on all the processing cores (or a sufficient number of them to represent a 'worst' possible case that a user application might experience) to produce both DC power demand and AC power demand for the processing cores that replicates real-world operations. Distributed checks can be provided, such as watchdog timers or error checking and reporting elements built into the processing device, and are monitored or report alerts if a failure, crash, or system hang occurs. A similar approach can be used for the GPU, where the functional test ensures the GPU and associated graphics cores focus on high levels of graphic rendering activity to produce worst case power consumption (DC and AC), temperature rises, on-chip noise, and a sufficient number of real data paths which produce accurate operational Vmins. North bridge testing can proceed similarly, and also include memory activity between off-device memory devices and on-chip portions that are serviced by those memory devices.

The power reduction using voltage adjustment processes herein can employ voltage regulation modules (VRMs) or associated power controller circuitry with selectable supply voltage increments, where the processing device communicates with the VRMs or associated power controller circuitry to indicate the desired voltage supply values during an associated power/functional test or state in which the processing device may be operating.

Once reduced voltage values have been determined, the processing device can receive input voltages set to a desired reduced value from associated VRMs. This allows input voltages for processing devices to be set below manufacturer specified levels, leading to several technical effects. For example, associated power savings can be significant, such as 30-50 watts in some examples, and cost savings can be realized in the design and manufacturing of reduced capacity system power supplies, reductions in the VRM specifications for the processing devices, cheaper or smaller heat sinks and cooling fans. Smaller system enclosures or packaging can be employed. Additionally, the power savings can result in system characteristics that reduce electrical supply demands or battery drain.

Figure 2:
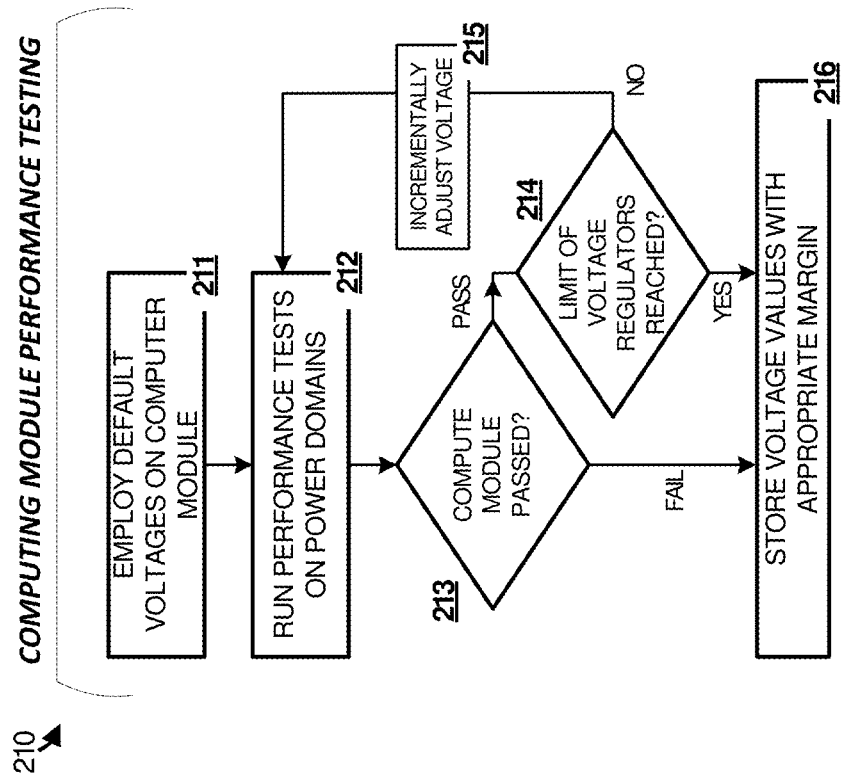
FIG. 2 illustrates a method of performance testing a circuit in an implementation.

FIG. 2 is included to illustrate operation of performance testing to determine performance properties of computing modules. Specifically, FIG. 2 is a flow diagram illustrating a method of operating elements of environment 100 in an implementation. In FIG. 2, a common performance test is executed on a batch or plurality of computing modules, such as several computing modules 131-138, among other computing modules.

This performance test can be executed by processors of the computing modules after booting into an operating system. During execution of the performance test on each computing module, supply voltages will be incrementally adjusted to determine a minimum functional operating voltage level. In one example, this performance test includes incrementally adjusting at least one supply voltage by initially operating the processing device of each computing module at a first supply voltage lower than a manufacturer specified operating voltage and progressively lowering the supply voltage in predetermined increments while performing the functional test and monitoring for occurrence of the operational failures. In another example, this performance test includes incrementally adjusting at least one supply voltage by initially operating the processing device of each computing module at a first supply voltage lower than a manufacturer specified operating voltage and progressively raising the supply voltage in predetermined increments while performing the functional test and monitoring for occurrence of the operational failures.

In manufacturing operations, each computing module is built and then tested individually according to a performance test. After the performance test has characterized each computing module for minimum operating voltage plus any applicable voltage margin, these computing modules can be assembled into a blade server assembly or other assembly. This performance test determines minimum supply voltages for proper operation of the computing module, which also relates to a power consumption of each computing module. Voltage is related to power consumption by Ohm's law and Joule's first law, among other relationships, and thus a lower operating voltage typically corresponds to a lower operating power for a computing module. Power consumption relates to an operating temperature, giving similar workloads for computing modules. Thus, the voltage adjustment method discussed in FIG. 2 allows a computing module to determine appropriate reduced input voltages for an on-board system processor 141, resulting in power savings for the computing module.

A processor device, such as system processor 141, is initially incorporated into a computing module, such as computing module 130 in FIG. 1. System processor 141 is shown installed into computing module 130, such as on a motherboard or other circuit board of computing module 130. Computing module 130 also includes many contextual assembly elements, as mentioned above. In many examples, computing module 130 is a system into which system processor 141 is installed during a system assembly process before testing and further assembly into blade assembly 120. Thus, the hardware and software elements included in computing module 130 might be the actual elements with which system processor 141 operates once installed at a computing site.

Computing module 130 initially employs (211) default voltages to provide power to system processor 141. For example, power system 142 can provide input voltages over associated power links according to manufacturer-specified operating voltages, which can be indicated by VID information received from system processor 141. In other examples, such as when progressively rising voltages are iteratively provided to system processor 141, the default voltages can comprise a starting point from which to begin raising voltage levels over time. In examples that employ incrementally rising voltages, starting voltages might be selected to be sufficiently low enough and less than those supplied by a manufacturer. Other default voltage levels can be employed. Once the input voltages are provided, system processor 141 can initialize and boot into an operating system or other functional state.

A manufacturing system might transfer one or more functional tests for execution by system processor 141 after booting into an operating system. A manufacturing system can transfer software, firmware, or instructions to computing module 130 to initiate one or more functional tests of computing module 130 during a voltage adjustment process. These functional tests can comprise performance tests that exercise the various integrated elements of system processor 141 as well as the various contextual assembly elements of computing module 130. Portions of the voltage adjustment process or functional tests can be present before boot up to adjust input voltages for system processor 141, such as by first initializing a first portion of system processor 141 before initializing second portions.

Once system processor 141 can begin executing the functional test, system processor 141 runs one or more performance tests on each of the power domains (212) of system processor 141. These power domains can include different input voltages and different input voltage levels. The functional tests can exercise two or more of the power domains simultaneously, which might further include different associated clock signals to run associated logic at predetermined frequencies. The functional tests can include operations initiated simultaneously on more than one processing core to produce both DC power demand and dynamic/AC power demand for the processing cores, graphics cores, and interfacing cores that replicates real-world operations. Moreover, the functional tests include processes that exercise elements of computing module 130 in concert with elements of system processor 141, such as storage devices, memory, communication interfaces, thermal management elements, or other elements.

System processor 141 will typically linger at a specific operating voltage or set of operating voltages for a predetermined period of time. This predetermined period of time allows for sufficient execution time for the functional tests to not only exercise all desired system and processor elements but also to allow any errors or failures to occur. The linger time can vary and be determined from the functional tests themselves, or set to a predetermined time based on manufacturing/testing preferences. Moreover, the linger time can be established based on past functional testing and be set to a value which past testing indicates will capture a certain population of errors/failures of system processors in a reasonable time.

If system processor 141 and computing module 130 do not experience failures or errors relevant to the voltage adjustment process during the linger time, then the specific input voltages employed can be considered to be sufficiently high to operate computing module 130 successfully (213). Thus, the particular iteration of input voltage levels applied to system processor 141 is considered a 'pass' and another progressively adjusted input voltage can be applied. As seen in operation (215) of FIG. 2, input voltages for system processor 141 can be incrementally lowered, system processor 141 restarted, and the functional tests executed again for the linger time. A restart of system processor 141 might be omitted in some examples, and further operational testing can be applied at a new voltage level for each linger timeframe in a continuous or repeating manner. This process is repeated until either lower limits of voltage regulators associated with power system 142 have been reached (214), or relevant failures of system processor 141 or computing module 130 are experienced. This process is employed to determine reduced operating voltages for system processor 141 in the context of the assembly elements of computing module 130. Once voltage adjustments for the associated power domains are found, indications of these voltage adjustments can be stored for later use at voltage 'minimums' (Vmins) in operation 216, optionally with margins appropriate for operational 'safety' to reduce undiscovered failures or errors during the functional testing.

The functional tests can comprise one or more applications, scripts, or other operational test processes that bring specific power domains up to desired power consumption and operation, which may be coupled with ensuring that computing module 130 is operating at preferred temperature as well. These functional tests may also run integrity checks (such as checking mathematical computations or checksums which are deterministic and repeatable). Voltages provided by power system 142 can be lowered one incremental step at a time and the functional tests run for a period of time until a failure occurs. The functional tests can automatically handle all possible failure modes resulting from lowering the voltage beyond functional levels. The possible failures include checksum errors detected at the test application level, a kernel mode crash detected by the operating system, a system hang, or hardware errors detected by system processor resulting in "sync flood" error mechanisms, among others. All failure modes can be automatically recovered from for further functional testing. To enable automatic recovery, a watchdog timer can be included and started in a companion controller, such as a "System Management Controller" (SMC), Embedded Controller, or other control circuitry. The functional tests can issue commands to the companion controller to initialize or reset the watchdog timer periodically. If the watchdog timer expires or system processor 141 experiences a failure mode, the companion controller can perform a system reset for computing module 130 or system processor 141. Failure modes that result in a system reset can prompt associated circuitry or companion controllers to initialize system processor 141 with 'default' or 'known good' voltage levels from power system 142. These default levels can include manufacturer specified voltages or include voltage levels associated with a most recent functional test 'pass' condition.

Once computing module 130 initializes or boots after a failure during the functional tests, the failure can be noted by a failure process in the functional tests or by another entity monitoring the functional tests, such as a manufacturing system. The voltage level can then be increased a predetermined amount, which might comprise one or more increments employed during the previous voltage lowering process. The increase can correspond to 2-3 increments in some examples, which might account for test variability and time-to-fail variability in the functional tests.

The voltage values determined from the voltage adjustment process can be stored (216) into a memory device or data structure along with other corresponding information, such as time/date of the functional tests, version information for the functional tests, or other information. Other stored information can include power consumption peak values, average values, or ranges, along with 'bins' into which each computing module is categorized. Stored voltage information can be used during power-on operations of computing module 130 to establish voltage levels to be provided by power system 142. The resulting computing module characteristics (e.g. power levels and thermal attributes) are substantially improved after the voltage adjustment process is completed. Thus, the voltage adjustment process described above allows systems to individually determine appropriate reduced operating voltages during a manufacturing or integration testing process.

The iterative voltage search procedure can be repeated independently for each power domain and for each power state in each domain where power savings are to be realized. For example, a first set of functional tests can be run while iteratively lowering an input voltage corresponding to a first voltage/power domain of system processor 141. A second set of functional tests can then be run while iteratively lowering a second input voltage corresponding to a second voltage/power domain of system processor 141. When the second set of functional tests are performed for the second input voltage, the first voltage can be set to a value found during the first functional tests or to a default value, among others.

Advantageously, end-of-line (EoL) voltage margin need not be added during manufacturing test or upon initial shipment of computing module 130. EoL margin can be added if desired, such as 10 to 50 millivolts (mV), among other values, or can be added after later in-situ testing described below. EoL margins are typically added in integrated circuit systems to provide sufficient guardband as associated silicon timing paths in the integrated circuit slow down over time with use. Although the amount of margin typically employed for EoL is only perhaps 15-30 mV (depending upon operating conditions, technology attributes, and desired life time), the systems described herein can eliminate this margin initially, either partially or entirely. In some examples, an initial voltage margin is employed incrementally above the Vmin at an initial time, and later, as the system operates during normal usage, further EoL margin can be incrementally added proportional to the total operational time (such as in hours) of a system or according to operational time for individual voltage domains. Thus, extra voltage margin is recovered from system processor 141 after the initial voltage adjustment process, and any necessary margin for EoL can be staged back over the operational lifetime of computing module 130. Moreover, by operating a user system at lower voltages for a longer period of time, system reliability is further improved. These benefits might taper off over the course of time as the EoL margin is staged back in, but it will improve the initial experience.

Figure 3:
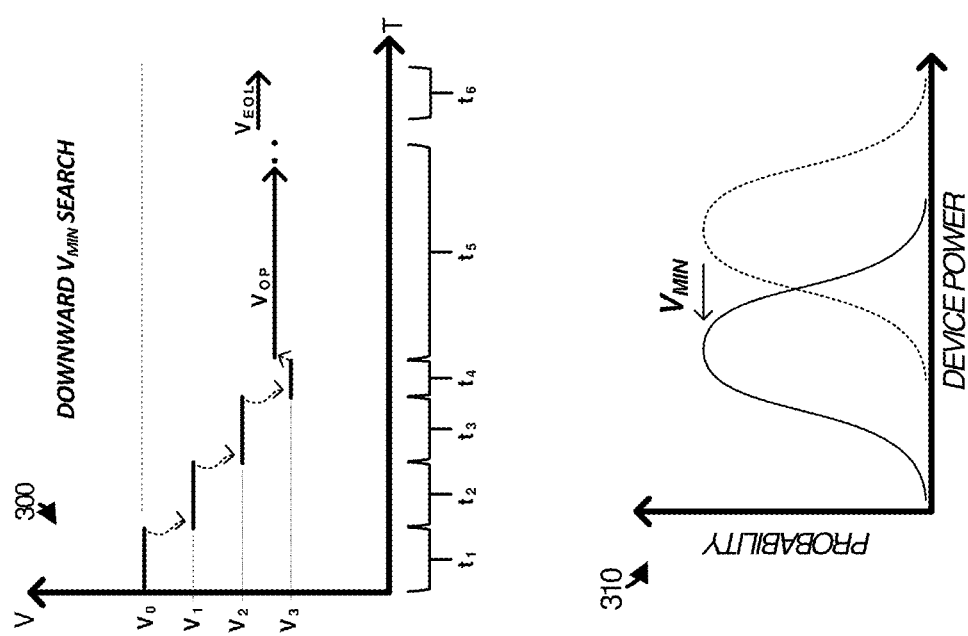
FIG. 3 illustrates a method of performance testing a circuit in an implementation.

FIG. 3 illustrates various graphs that show how a voltage adjustment process might progress, namely in graph 300. Graph 300 shows a 'downward' incremental Vmin search using progressively lowered voltages, with safety margin added at the end of the process to establish an operational voltage, $V_{OP}$. Later margin ($V_{BOL}$) can be staged in to account for EoL concerns. Specifically, graph 300 shows a default or initial voltage level $V_0$ applied to a system processor. After a linger time for a functional test, a successful outcome prompts an incremental lowering to $V_1$ and retesting under the functional test. Further incremental lowering can be performed for each successful iteration of the functional test for an associated time indicated in graph 300. Finally, a lowest or reduced operating voltage is found at $V_3$ and optional margin is applied to establish $V_{OP}$. $V_{OP}$ is employed for the normal operation of the system processor for a period of operational time indicated by $t_5$. This time can occur while an associated system is deployed on-site. After a designated number of hours indicated by $t_5$, EoL margin can be staged in to established $V_{BOL}$. Multiple stages of EoL margin can occur, although only one is shown in graph 300 for clarity.

The voltage levels indicated in FIG. 3 can vary and depend upon the actual voltage levels applied to a system processor. For example, for a device operating around 0.9V, a reduced voltage level can be discovered using the processes in graph 300. Safety margin of 50 mV might be added in graph 300 to establish $V_{OP}$ and account for variation in user applications and device aging that will occur over time. However, depending upon the operating voltage, incremental step size, and aging considerations, other values could be chosen. In contrast to the downward voltage search in graph 300, an upward voltage search process can instead be performed. An upward voltage search process uses progressively raised voltages to establish an operational voltage, $V_{OP}$. Later margin ($V_{BOL}$) can be staged in to account for EoL concerns.

The processes in graph 300 can be executed independently for each power supply or power domain associated with a system processor. Running the procedure on one power supply or power domain at a time can allow for discrimination of which power supply or power domain is responsible for a system failure when looking for the Vmin of each domain. However, lowering multiple voltages for power supplies or power domains at the same time can be useful for reducing test times, especially when failure can be distinguished among the various power supplies or power domains. In further examples, a 'binary' voltage adjustment/search algorithm can be used to find the Vmin by reducing the voltage half way to an anticipated Vmin as opposed to stepping in the increments of graph 300. In such examples, a Vmin further testing might be needed by raising the voltage once a failure occurred and successfully running system tests at that raised value. Other voltage adjustment/search techniques could be used and the techniques would not deviate from the operations to establish a true Vmin in manufacturing processes that can then be appropriately adjusted to provide a reasonable margin for end user operation.

Also included in FIG. 3 is graph 310. Graph 310 illustrates potential power savings for a population of devices, such as system processors. As a Vmin is established for each device, the population of power consumptions for the devices indicated by the 'Gaussian' distribution will shift to the left, indicating a lower overall power consumption for the devices. It should be noted that in examples without 'normal' distributions of devices, a shift in the population of power consumption can also occur for those distributions. As power consumption is reduced, thermal performance also is modified. Specifically, a lower power consumption generally relates to a lower operating temperature for a particular computing module for a given workload.

Figure 4:
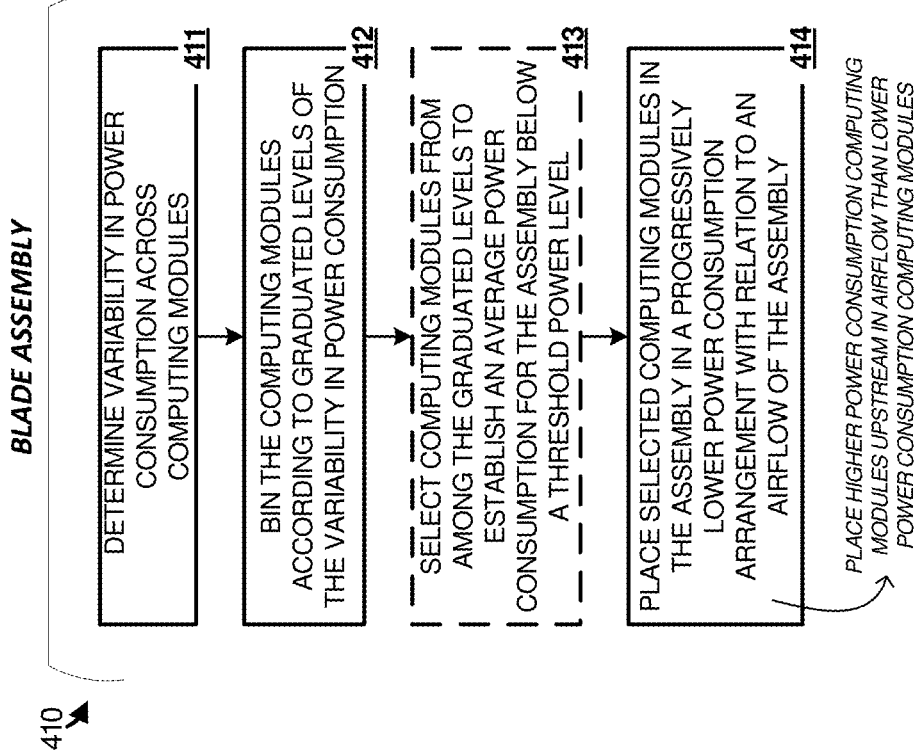
FIG. 4 illustrates a method of assembling a circuit in an implementation.

FIG. 4 is included to illustrate operation of manufacturing and assembly of individual computing modules into a blade assembly. Specifically, FIG. 4 is a flow diagram illustrating a method of assembling elements of environment 100 in an implementation. In FIG. 4, a manufacturing system or manufacturing apparatus can be employed to assemble individual computing modules into an assembled unit, such as onto a blade assembly, common circuit board, or other configurations. An example manufacturing system can be seen in FIG. 7. For the discussion of FIG. 4, any suitable manufacturing system or assembly system can be employed, which might include control systems, testing systems, actuation systems, pick-and-sort systems, component placement systems, and the like.

In FIG. 4, a manufacturing system determines (411) variability in power consumption across computing modules. This variability in power consumption can be related to the minimum voltage levels determined in a voltage determination process. FIGS. 2 and 3 detail such a voltage determination process that employs a performance test executed by each of a plurality of computing modules. A common performance test is executed on a batch or plurality of computing modules, such as several computing modules 131-138, among other computing modules. Based on the results of the performance test, minimum voltage levels are determined for one or more voltage domains of the computing modules. These minimum voltage levels relate to power consumption of the computing modules, as well as thermal dissipation under various workloads. Thus, a characterization of each computing module can be made for a power consumption level, which might indicate average power consumption levels, peak power consumption levels, or other metrics. For the sake of discussion, an average power consumption level for each computing module is employed herein. Also, instead of average power consumption, an average thermal dissipation or average operating temperature might be used to differentiate among computing modules. However, power consumption and thermal dissipation are typically related or correlated. Thus, the discussion of FIG. 4 will focus on power consumption for clarity.

The manufacturing system sorts or bins (412) the computing modules according to graduated levels of the variability in power consumption. Graduated levels indicate ranges of power consumption into which individual ones of the computing modules are sorted after the performance testing has completed. In a first example, two bins are used, with a power consumption threshold level used to differentiate among the two bins, namely a high power consumption bin and a low power consumption bin. In a second example, three or more bins are used, with associated power consumption threshold levels used to differentiate among the bins. For example, three bins might be employed, a high, medium, and low power consumption bin—each with an associated graduated level in power consumption or power consumption range.

One specific example might have a maximum power consumption level of the computing modules at approximately 60 Watts (W). The performance testing can indicate reduced functional levels of power consumption for each of the computing modules. Example bins can include a first bin having a power consumption range of 30-37 W, a second bin having a power consumption range of 38-46 W, and a third bin having a power consumption range of 47-60 W. Other ranges can be established, and these ranges might be based in part on statistical populations of computing modules detected over time so as to include a similar quantity of computing modules in each bin range/graduation. Thus, with the binning process described in operation 412, a quantity of computing modules is sorted into each bin after a determination of corresponding power consumption levels using a performance test. These power consumption levels are typically lower than a manufacturer specification maximum power consumption, often significantly lower, due at least in part to the lower associated operating voltages.

The manufacturing system can then select (413) computing modules from among the graduated levels or bins to establish an average power consumption for the assembly below a threshold power level. In the example of a blade server having blade assembly 120, several modular locations might be provided on a circuit board or collection of circuit boards which form blade assembly 120. These modular locations can accept individual computing modules 130. In the example shown in FIG. 1, eight (8) computing modules 131-138 are included, each with a corresponding modular location defined by an associated connector or connectors as well as physical space on a circuit board to fit the corresponding computing module. Among the modular locations, a total average power level for blade assembly 120 might be established by selecting specific ones of the computing modules. A first set of computing modules might be selected from a first bin having individual power consumption levels below a first threshold level, while a second set of computing modules might be selected from a second bin having individual power consumption levels above the first threshold level. By selecting quantities of computing modules form the first bin and second bin, on average, a collection of computing modules installed into blade assembly 120 can have a total average power consumption below a threshold level. Thus, an average power consumption for the entire assembly can be below target power consumption level.

Although a binning process is described above, this process can be applied to non-binned operations as well. For example, blade assembly power consumption can be stepped down with regard to airflow directionality when bins are not employed. Thus, individual computing modules can be selected with a decreasing power consumption with regard to airflow. Higher power consumption computing modules can be placed upstream in an airflow in relation to lower power consumption computing modules. However, using discrete bins with associated power ranges can aid in achieving average power targets of assemblies as well as entire racks into which those assemblies are ultimately installed.

In FIG. 1, four computing modules 131-134 are selected as having a "high" power consumption. This high power consumption refers to a power consumption per-module as above a threshold power level. Four computing modules 135-138 are selected as having a "low" power consumption. This low power consumption refers to a power consumption per-module as below a threshold power level. Although a single threshold power level per-module is discussed in this example, it should be understood that multiple power consumption thresholds might be employed that correspond to individual bins discussed in operation 412. An average power consumption for blade assembly 120 can be established by selection of computing modules in the various bins.

In FIG. 1, airflow element 121 provides airflow across components of blade assembly 120, as indicated by the arrows. This airflow might be pushed or pulled across blade assembly 120, and there will be an upstream property and downstream property of the airflow with relation to airflow element 121. The location of blade assembly 120 where cooler outside air is introduced will be referred to as the upstream portion of the airflow, while the location of blade assembly 120 where warmer air is expelled will be referred to as the downstream portion of the airflow. The upstream portion will typically have cooler air which is being introduced to blade assembly 120 by airflow element 121, while the downstream portion will typically have air that has already been warmed due to passage over and near other components of blade assembly 120. Computing modules which exhibit higher power consumption on average will typically be placed upstream of computing modules which exhibit lower power consumption on average.

In addition to selecting computing modules according to average power dissipation for blade assembly 120 and according to individual bins of power consumption for each computing module, the manufacturing system also can place (414) selected computing modules in blade assembly 120 in a progressively lower power consumption arrangement with relation to an airflow of blade assembly 120. The manufacturing system selects from among the graduated levels of the bins for placement in blade assembly 120 of ones of the computing modules in a progressively lower power consumption arrangement with relation to an airflow of blade assembly 120. In FIG. 1, certain higher power consumption computing modules are placed upstream in the airflow as compared to certain lower power consumption computing modules. Specifically, computing modules 131-134 are placed upstream of computing modules 135-138. More than two graduated levels might be employed. For example, a third set of computing modules with a medium level of power consumption can be placed in between computing modules 131-134 and computing modules 135-138.

Figure 5:
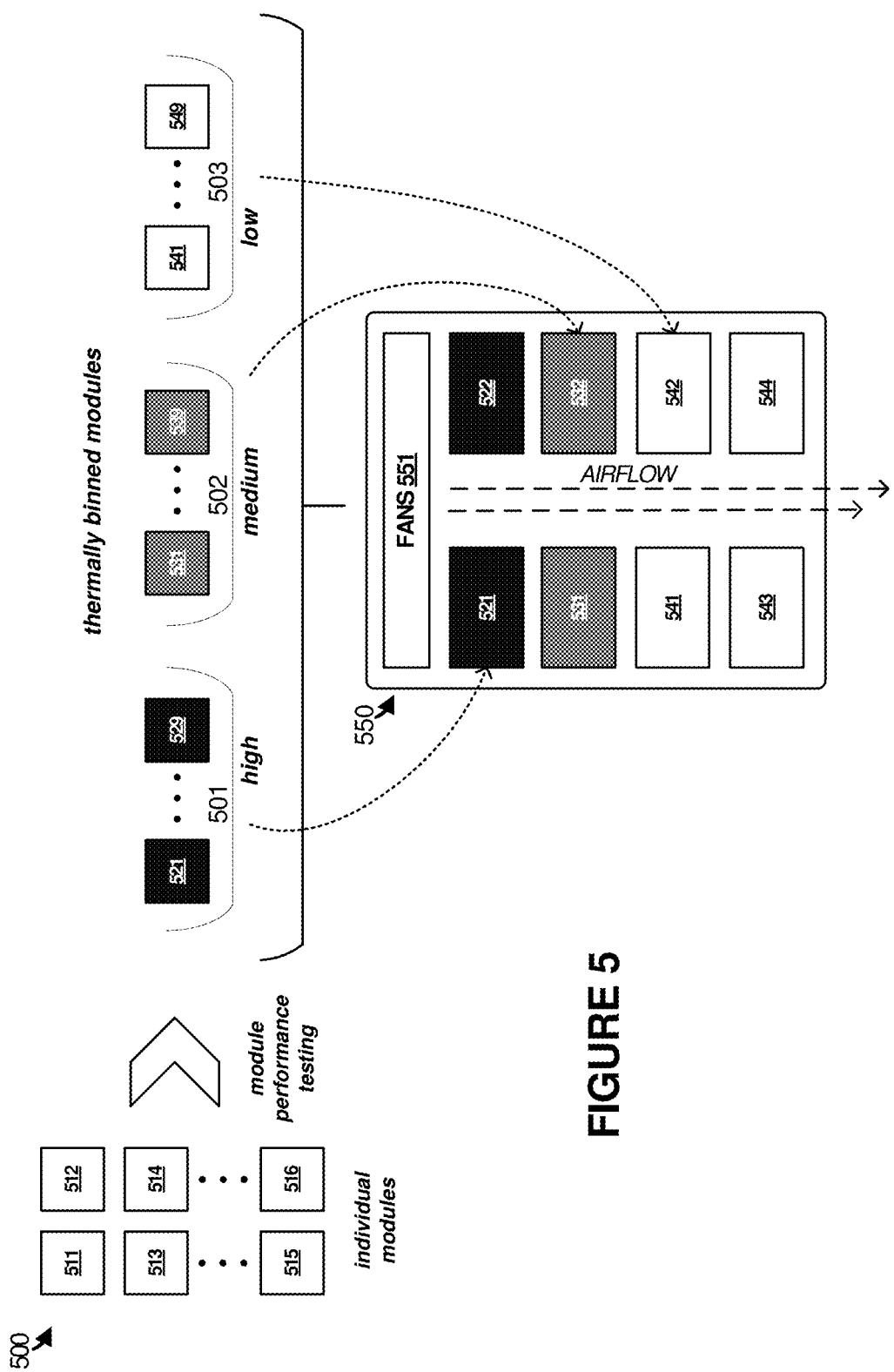
FIG. 5 illustrates performance-based sorting of computing modules in an implementation.

FIG. 5 is now presented to illustrate example binning or sorting process 500, such as described above in operation 412 of FIG. 4. In FIG. 5, 'n' quantity of computing modules 511-516 are individually performance tested to determine average power consumption levels based on minimum operating voltages. Various performance testing, such as described above, can be executed by each computing module by booting the associated computing module into an operating system and executing one or more application-level performance tests while incrementally adjusting supply voltages to a system processor on each computing module.

This performance testing can be used to sort or bin each computing module into two or more graduated levels. Without airflow from a fan or other cooling system, a predicted thermal performance or operating temperature of a computing module can be related in part to the associated power consumption levels determined from standardized performance testing. In FIG. 5, three such bins 501-503 are shown, namely a first bin 501 corresponding to a "high" average power consumption level that includes computing modules 521-529, a second bin 502 corresponding to a "medium" average power consumption level that includes computing modules 531-539, and a third bin 503 corresponding to a "low" average power consumption level that includes computing modules 541-549. Each of the bins can have an assigned range of average power consumption levels. These average power consumption levels might also correspond to a range of predicted operating temperatures while under a similar load or operating environment. For example, bin 501 might correspond to a first operating temperature range, bin 502 might be for a second operating temperature range, and bin 503 might be for a third operating temperature range. The binning process can include an automated mechanism which applies a standardized test across individual computing modules, determines minimum operating voltages for at least one supply voltage of the computing modules, and identifies ones of the computing modules as being members of the various bins. A physical sorting into separate locations, containers, or physical bins might occur. Instead, a labeling or information-based record of which computing modules are assigned to each bin might instead occur. Tagging of each computing module can also occur to indicate an associated bin based on power level or predicted operating temperature.

Assembly of ones of the computing modules into blade server 550 can then occur. Selection among bins 501-503 can be made based on a target power consumption level for blade server 550 or a target operating temperature for blade server 550. Thus, a quantity from each bin can be selected to arrive at a target power consumption level or target operating temperature which is established by the individually selected computing modules. Moreover, the actual locations within blade server 550 can be selected based on the individual average power consumption levels of the computing modules and bins.

In FIG. 5, blade server 550 has a first set of computing modules 521-522 selected from bin 501. Computing modules 521-522 have a first power consumption range associated with bin 501. Blade server 550 has a second set of computing modules 531-532 selected from bin 502. Computing modules 531-532 have a second power consumption range associated with bin 502. Blade server 550 has a third set of computing modules 541-544 selected from bin 503. Computing modules 541-544 have a third power consumption range associated with bin 503. Additionally, fans 551 are included in blade server 550 at a first end of blade server 550, which direct airflow from outside of blade server 550 over the computing modules as shown. Various chassis elements and enclosures can be included in blade server 550, but are omitted in FIG. 5 for clarity.

Since the first set of computing modules 521-522 are from bin 501 with the highest predicted operating power range among the bins, which might also correspond to the highest potential operating temperatures. The first set of computing modules 521-522 can be placed closest to fans 551 to assist in keeping these computing modules cooler. Lower operating power computing modules can be placed downstream of the first set of computing modules 521-522 as seen in FIG. 5. These lower operating power computing modules might have lower operating temperatures due in part to the lower average operating power, and thus can accept airflow which has been pre-heated by at least the first set of computing modules 521-522.

As a result, the thermal management of blade server 550 becomes more manageable as the computing modules that benefit from more cooling receive lower temperature air and those that benefit from less cooling are put in a position where they receive the air with the most pre-heat. Beyond thermal management, the overall blade power is kept at a lower level as an explicit mix of bin power levels is utilized to ensure that the blade server 550 is not assembled with all maximum power dissipation (or near maximum dissipation power) computing modules. Also, at a rack level, there are power savings by constructing a rack with many blade servers assembled according to the enhanced processes described herein. An entire rack can be ensured to have a predefined mix of computing modules, so the average power of that mix will influence the overall rack power dissipation.

As an example of the computing modules discussed herein, FIG. 6 is presented. FIG. 6 includes computing module 600. Computing module 600 can be used to implement computing modules 130-138 in FIG. 1 and any computing module in FIG. 5, although variations are possible. Examples of computing module 600 include modularized versions of various computer-based systems. These can include, but are not limited to, gaming systems, smartphones, tablet computers, laptops, servers, customer equipment, access terminals, personal computers, Internet appliances, media players, or some other computing apparatus, including combinations thereof. In a specific example, computing module 600 can comprise an Xbox gaming system modularized onto a single circuit board or multiple circuit boards that communicate over a shared connector 601 and couple to a main board or motherboard of a blade server. The modularized Xbox gaming system can be configured to remotely service interactive gaming applications to end users over one or more network links carried by connector 601.

Computing module 600 may be implemented as a single apparatus, system, or device or may be implemented in a distributed manner as multiple apparatuses, systems, or devices. Computing module 600 includes, but is not limited to, system on a chip (SoC) device 610, south bridge 620, storage system 621, video elements 622, memory elements 623, network module 624, input power conditioning circuitry 630, and power system 660. SoC device 610 is operatively coupled with the other elements in computing module 600, such as south bridge 620, storage system 621, video elements 622, memory elements 623, network module 624. SoC device 610 receives power over power links 661-663 as supplied by power system 660. One or more of the elements of computing module 600 can be included on motherboard 602, although other arrangements are possible.

Referring still to FIG. 6, SoC device 610 may comprise a micro-processor and processing circuitry that retrieves and executes software from storage system 621. Software can include various operating systems, user applications, gaming applications, multimedia applications, or other user applications. SoC device 610 may be implemented within a single processing device, but may also be distributed across multiple processing devices or sub-systems that cooperate in executing program instructions. Examples of SoC device 610 include general purpose central processing units (CPUs), application specific processors, graphics processing units (GPUs), and logic devices, as well as any other type of processing device, combinations, or variations thereof. In FIG. 6, SoC device 610 includes processing cores 611, graphics cores 612, communication interfaces 613, and memory interfaces 614, among other elements. Some of the noted elements of SoC device 610 can be included in a north bridge portion of SoC device 610.

Data storage elements of computing module 600 include storage system 621 and memory elements 623. Storage system 621 and memory elements 623 may comprise any computer readable storage media readable by SoC device 610 and capable of storing software. Storage system 621 and memory elements 623 may include volatile and nonvolatile, removable and non-removable media implemented in any method or technology for storage of information, such as computer readable instructions, data structures, program modules, or other data. Examples of storage media include random access memory (RAM), read only memory, solid state storage devices, magnetic disks, optical disks, flash memory, virtual memory and non-virtual memory, magnetic storage devices, or any other suitable storage media. Storage system 621 may comprise additional elements, such as a controller, capable of communicating with SoC device 610 or possibly other systems.

South bridge 620 includes interfacing and communication elements which can provide for coupling of SoC 610 to peripherals over connector 601, such as optional user input devices, user interface devices, printers, microphones, speakers, or other external devices and elements. In some examples, south bridge 620 includes a system management bus (SMB) controller or other system management controller elements.

Video elements 622 comprise various hardware and software elements for outputting digital images, video data, audio data, or other graphical and multimedia data which can be used to render images on a display, touchscreen, or other output devices. Digital conversion equipment, filtering circuitry, image or audio processing elements, or other equipment can be included in video elements 622.

Network elements 634 can provide communication between computing module 600 and other computing systems or end users (not shown), which may occur over a communication network or networks and in accordance with various communication protocols, combinations of protocols, or variations thereof. Example networks include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

Power system 660 provide operating voltages at associated current levels to at least SoC device 610. In many examples, the conversion of power discussed herein comprises converting an input voltage received over connector 601 to different output voltages or supply voltages on links 661-663, along with any related voltage regulation. Power system 660 comprises various power electronics, power controllers, DC-DC conversion circuitry, AC-DC conversion circuitry, gate modulation circuitry, power transistors, half-bridge elements, filters, passive components, and other elements to convert input power received through input power conditioning elements 630 over connector 601 from a power source into voltages usable by SoC device 610.

Some of the elements of power system 660 might be included in input power conditioning 630. Input power conditioning 630 can include filtering, surge protection, electromagnetic interference (EMI) protection and filtering, as well as perform other input power functions for input power 603. In some examples, input power conditioning 630 includes AC-DC conversion circuitry, such as transformers, rectifiers, power factor correction circuitry, or switching converters. When a battery source is employed as input power, then input power conditioning 630 can include various diode protection, DC-DC conversion circuitry, or battery charging and monitoring circuitry.

Power system 660 can instruct voltage regulation circuitry included therein to provide particular voltage levels for one or more voltage domains. Power system 660 can instruct voltage regulation circuitry to provide particular voltage levels for one or more operational modes, such as normal, standby, idle, and other modes. Voltage regulation circuitry can comprise adjustable output switched-mode voltage circuitry or other regulation circuitry, such as DC-DC conversion circuitry. Power system 660 can incrementally adjust output voltages provided over links 661-663 as instructed by a performance test. Links 661-663 might each be associated with a different voltage domain or power domain of SoC 610.

Power system 660 can comprise one or more microprocessors and other processing circuitry that retrieves and executes software or firmware, such as voltage control firmware and performance testing firmware, from an associated storage system. Power system 660 can be implemented within a single processing device but can also be distributed across multiple processing devices or sub-systems that cooperate in executing program instructions. Examples of power system 660 include general purpose central processing units, application specific processors, and logic devices, as well as any other type of processing device, combinations, or variations thereof. In some examples, power system 660 comprises an Intel® or AMD® microprocessor, ARM® microprocessor, FPGA, ASIC, application specific processor, or other microprocessor or processing elements.

Figure 7:
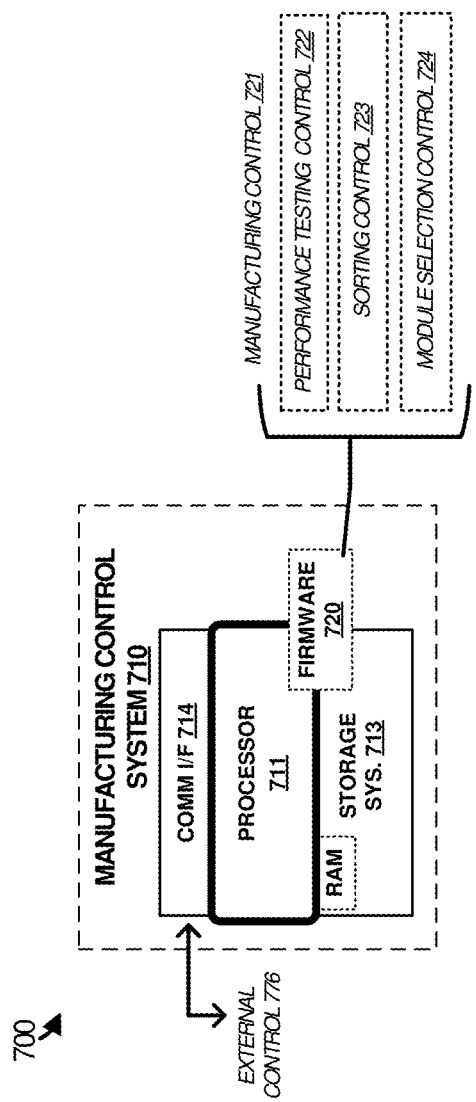
FIG. 7 illustrates an example manufacturing control system suitable for implementing any of the architectures, platforms, processes, methods, and operational scenarios disclosed herein.

FIG. 7 illustrates manufacturing control system 710 that is representative of any system or collection of systems from which the various performance testing, binning, and assembly operations can be directed. Any of the manufacturing-related operational architectures, platforms, scenarios, and processes disclosed herein may be implemented using elements of manufacturing control system 710. Examples of manufacturing control system 710 include, but are not limited to, manufacturing control console, computer, laptop, server, manufacturing equipment control systems, or other devices.

Manufacturing control system 710 may be implemented as a single apparatus, system, or device or may be implemented in a distributed manner as multiple apparatuses, systems, or devices. Manufacturing control system 710 includes, but is not limited to, processor 711, storage system 713, communication interface system 714, and firmware 720. Processor 711 is operatively coupled with storage system 713 and communication interface system 714.

Processor 711 loads and executes firmware 720 from storage system 713. Firmware 720 includes manufacturing control 721, which is representative of the processes discussed with respect to the preceding Figures. When executed by processor 711 to enhance testing, assembly, or manufacturing of server equipment, firmware 720 directs processor 711 to operate as described herein for at least the various processes, operational scenarios, and sequences discussed in the foregoing implementations. Manufacturing control system 710 may optionally include additional devices, features, or functionality not discussed for purposes of brevity.

Referring still to FIG. 7, processor 711 may comprise a microprocessor and processing circuitry that retrieves and executes firmware 720 from storage system 713. Processor 711 may be implemented within a single processing device, but may also be distributed across multiple processing devices, sub-systems, or specialized circuitry, that cooperate in executing program instructions and in performing the operations discussed herein. Examples of processor 711 include general purpose central processing units, application specific processors, and logic devices, as well as any other type of processing device, combinations, or variations thereof.

Storage system 713 may comprise any computer readable storage media readable by processor 711 and capable of storing firmware 720. Storage system 713 may include volatile and nonvolatile, removable and non-removable media implemented in any method or technology for storage of information, such as computer readable instructions, data structures, program modules, or other data. Examples of storage media include random access memory (RAM), read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 713 may also include computer readable communication media over which at least some of firmware 720 may be communicated internally or externally. Storage system 713 may be implemented as a single storage device, but may also be implemented across multiple storage devices or sub-systems co-located or distributed relative to each other. Storage system 713 may comprise additional elements, such as a controller, capable of communicating with processor 711 or possibly other systems.

Firmware 720 may be implemented in program instructions and among other functions may, when executed by processor 711, direct processor 711 to operate as described with respect to the various operational scenarios, sequences, and processes illustrated herein. For example, firmware 720 may include program instructions for enhanced testing, assembly, or manufacturing of server equipment, among other operations.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Firmware 720 may include additional processes, programs, or components, such as operating system software or other application software, in addition to that of manufacturing control 721. Firmware 720 may also comprise program code, scripts, macros, and other similar components. Firmware 720 may also comprise software or some other form of machine-readable processing instructions executable by processor 711.

In general, firmware 720 may, when loaded into processor 711 and executed, transform a suitable apparatus, system, or device (of which manufacturing control system 710 is representative) overall from a general-purpose computing system into a special-purpose computing system customized to facilitate enhanced testing, assembly, or manufacturing of server equipment. Indeed, encoding firmware 720 on storage system 713 may transform the physical structure of storage system 713. The specific transformation of the physical structure may depend on various factors in different implementations of this description. Examples of such factors may include, but are not limited to, the technology used to implement the storage media of storage system 713 and whether the computer-storage media are characterized as primary or secondary storage, as well as other factors.

For example, if the computer readable storage media are implemented as semiconductor-based memory, firmware 720 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Manufacturing control 721 can include one or more software elements, such as an operating system, devices drivers, and one or more applications. These elements can describe various portions of manufacturing control system 710 with which manufacturing equipment, testing equipment, sorting/binning equipment, or other elements interact. For example, an operating system can provide a software platform on which manufacturing control 721 is executed and allows for enhanced testing, assembly, or manufacturing of server equipment, among other operations.

In one example, performance testing control 722 is configured to direct execution of a performance test on a plurality of computing modules to determine at least variability in power consumption across the plurality of computing modules. The performance test can be executed on each of a plurality of computing modules to determine minimum operating voltages lower than a manufacturer specified operating voltage for at least one supply voltage common to the plurality of computing modules. Transfer of the performance test to each computing module can occur over link 776 or other links. The performance test can comprise computer-readable instructions stored within storage system 713. The performance test might comprise a system image or bootable image which includes an operating system, applications, performance tests, voltage regulator control instructions, and other elements which are transferred over link 776 to a target computing module under test.

In some examples, the performance test for each of the plurality of computing modules comprises iteratively booting a processing device of a target computing module into an operating system after reducing a voltage level of at least one supply voltage applied to at least one voltage domain of the target computing module. For each reduction in the at least one supply voltage, the performance test includes executing a voltage characterization service to perform one or more functional tests that run one or more application level processes in the operating system and exercise processor core elements and interface elements of the processing device in context with a plurality of elements external to the processing device on the target computing module which share the at least one supply voltage. The performance test also includes monitoring for operational failures of at least the processing device during execution of the voltage characterization service, and based at least on the operational failures, determining at least one resultant supply voltage, wherein the at least one resultant supply voltage relates to a power consumption for the target computing module. Iterative booting of the processing device of the target computing module can comprise establishing a minimum operating voltage for the at least one supply voltage based on a current value of the iteratively reduced voltages, adding a voltage margin to the minimum operating voltage to establish the at least one resultant supply voltage, and instructing voltage regulator circuitry of the target computing module to supply the at least one resultant supply voltage to the processing device for operation of the processing device.

Sorting control 723 can direct selection of computing modules based on results of the performance testing. This selection can place individual computing modules into separate bins or categories defined by graduated levels of variability in power consumption or thermal performance (such as predicted operating temperatures). Sorting control 723 can direct pick-and-place equipment or other sorting equipment over link 776 or other links.

Module selection control 724 can select from among the graduated levels or bins to establish an average power consumption for an assembly below a threshold power level. Module selection control 724 might process a target power consumption level or threshold for an assembly, and based on the bin levels and contents of the bins, select individual computing modules for inclusion in an assembly. Module selection control 724 can also select from among the graduated levels for placement in an assembly of ones of the computing modules in a progressively lower power consumption arrangement with relation to an airflow of the assembly. Module selection control 724 might control an assembly machine or manufacturing equipment which assembles individual computing modules onto a main circuit board or motherboard of a server assembly. Module selection control 724 can direct placement of computing modules over link 776, such as to place first ones of a set of computing modules at first locations on a motherboard, second ones of a set of computing modules at second locations on the motherboard, and third ones of a set of computing modules at third locations on the motherboard to achieve a progressively lower power consumption arrangement or progressively lower thermal dissipation arrangement among the set of computing modules.

Communication interface system 714 may include communication connections and devices that allow for communication over link 776 with other computing systems (not shown) over communication networks (not shown). Examples of connections and devices that together allow for inter-system communication may include network interface cards, antennas, power amplifiers, RF circuitry, transceivers, and other communication circuitry. The connections and devices may communicate over communication media to exchange packetized communications with other computing systems or networks of systems, such as metal, glass, air, or any other suitable communication media. Communication interface system 714 may include user interface elements, such as programming registers, status registers, control registers, APIs, or other user-facing control and status elements.

Communication between manufacturing control system 710 and other systems (not shown), may occur over a link 776 comprising a communication network or networks and in accordance with various communication protocols, combinations of protocols, or variations thereof. These other systems can include manufacturing systems, such as testing equipment, assembly equipment, sorting equipment, binning equipment, pick-and-place equipment, soldering equipment, final assembly equipment, or inspection equipment, among others. Communication interfaces might comprise system management bus (SMB) interfaces, inter-integrated circuit (I2C) interfaces, or other similar interfaces. Further examples include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

Certain inventive aspects may be appreciated from the foregoing disclosure, of which the following are various examples.

Example 1

A method comprising executing a performance test on a plurality of computing modules to determine at least variability in power consumption across the plurality of computing modules, and binning the plurality of computing modules according to graduated levels of the variability in power consumption. The method also includes selecting from among the graduated levels for placement in an assembly of ones of the computing modules in a progressively lower power consumption arrangement with relation to an airflow of the assembly.

Example 2

The method of Example 1, wherein the variability in power consumption relates to predicted operating temperatures of the plurality of computing modules, and further comprising selecting placement locations in the assembly for the ones of the computing modules based on the predicted operating temperatures to establish the progressively lower power consumption arrangement.

Example 3

The method of Examples 1-2, wherein determining at least the variability in power consumption comprises executing the performance test to determine minimum operating voltages lower than a manufacturer specified operating voltage for at least one supply voltage common to the plurality of computing modules.

Example 4

The method of Examples 1-3, further comprising selecting from among the graduated levels to establish an average power consumption for the assembly below a threshold power level.

Example 5

The method of Examples 1-4, wherein a first graduated level in power consumption comprises power consumption below a power consumption threshold, and wherein a second graduated level in power consumption comprises power consumption above the power consumption threshold. The method further includes comprising for first ones of the plurality of computing modules corresponding to the first graduated power level, placing into locations in the assembly further downstream in the airflow than second ones of the plurality of computing modules corresponding to the second graduated power level.

Example 6

The method of Examples 1-5, wherein a first graduated level in power consumption comprises power consumption below a first power consumption threshold, wherein a second graduated level in power consumption comprises power consumption above a second power consumption threshold, and wherein a third graduated level in power consumption comprises power consumption between the first power consumption threshold and the second power consumption threshold. The method further includes, for first ones of the plurality of computing modules corresponding to the first graduated power level, placing into locations in the assembly further downstream in the airflow than third ones of the plurality of computing modules. For the third ones of the plurality of computing modules, the method further includes placing into locations in the assembly further downstream in the airflow than second ones of the plurality of computing modules corresponding to the second graduated power level.

Example 7

The method of Examples 1-6, wherein the performance test for each of the plurality of computing modules comprises iteratively booting a processing device of a target computing module into an operating system after reducing a voltage level of at least one supply voltage applied to at least one voltage domain of the target computing module. For each reduction in the at least one supply voltage, the performance test includes executing a voltage characterization service to perform one or more functional tests that run one or more application level processes in the operating system and exercise processor core elements and interface elements of the processing device in context with a plurality of elements external to the processing device on the target computing module which share the at least one supply voltage. The performance test also includes monitoring for operational failures of at least the processing device during execution of the voltage characterization service, and based at least on the operational failures, determining at least one resultant supply voltage, wherein the at least one resultant supply voltage relates to a power consumption for the target computing module.

Example 8

The method of Examples 1-7, wherein the iterative booting of the processing device comprises establishing a minimum operating voltage for the at least one supply voltage based on a current value of the iteratively reduced voltages, adding a voltage margin to the minimum operating voltage to establish the at least one resultant supply voltage, and instructing voltage regulator circuitry of the target computing module to supply the at least one resultant supply voltage to the processing device for operation of the processing device.

Example 9

The method of Examples 1-8, wherein the assembly comprises an enclosure, at least one circuit board comprising connectors configured to couple to corresponding computing modules, and a fan assembly positioned at one end of the enclosure and configured to produce the airflow through the enclosure.

Example 10

The method of Examples 1-9, wherein each of the plurality of computing modules comprise a gaming system in a modular form factor configured to remotely service interactive gaming applications to end users over one or more network links.

Example 11

An apparatus, comprising a circuit board assembly, a fan assembly disposed proximate to a first end of the circuit board assembly, and a plurality of computing modules coupled to the circuit board assembly selected to achieve an average power consumption for the apparatus. The plurality of computing modules are individually characterized for power consumption properties based on results of a performance test executed by each computing module. The plurality of computing modules are arranged on the circuit board assembly in a progressively lower power consumption arrangement with relation to an airflow of the fan assembly.

Example 12

The apparatus of Example 11, wherein the plurality of computing modules are arranged on the circuit board assembly to locate first ones of the plurality of computing modules having power consumption levels above a threshold power consumption further upstream in the airflow than second ones of the plurality of computing module that have power consumption levels below the threshold power consumption.

Example 13

The apparatus of Examples 11-12, wherein third ones of the plurality of computing modules have power consumption levels between the first ones of the plurality of computing modules and the second ones of the plurality of computing modules, and wherein the plurality of computing modules are further arranged on the circuit board assembly to locate the third ones of the plurality of computing modules between the first ones of the plurality of computing modules and the second ones of the plurality of computing modules.

Example 14

The apparatus of Examples 11-13, wherein individually characterizing the power consumption comprises executing the performance test to determine minimum operating voltages lower than a manufacturer specified operating voltage for at least one supply voltage common to the plurality of computing modules.

Example 15

The apparatus of Examples 11-14, wherein the performance test for each of the plurality of computing modules comprises iteratively booting a processing device of a target computing module into an operating system after reducing a voltage level of at least one supply voltage applied to at least one voltage domain of the target computing module. For each reduction in the at least one supply voltage, the performance test includes executing a voltage characterization service to perform one or more functional tests that run one or more application level processes in the operating system and exercise processor core elements and interface elements of the processing device in context with a plurality of elements external to the processing device on the target computing module which share the at least one supply voltage. The performance test includes monitoring for operational failures of at least the processing device during execution of the voltage characterization service, and based at least on the operational failures, determining at least one resultant supply voltage, wherein the at least one resultant supply voltage relates to a power consumption level for the target computing module.

Example 16

The apparatus of Examples 11-15, wherein the iterative booting of the processing device comprises establishing a minimum operating voltage for the at least one supply voltage based on a current value of the iteratively reduced voltages, adding a voltage margin to the minimum operating voltage to establish the at least one resultant supply voltage, and instructing voltage regulator circuitry of the target computing module to supply the at least one resultant supply voltage to the processing device for operation of the processing device.

Example 17

The apparatus of Examples 11-16, wherein each of the plurality of computing modules comprise a gaming system in a modular form factor configured to couple to the circuit board assembly and configured to remotely service interactive gaming applications to end users over one or more network links.

Example 18

An apparatus comprising one or more computer readable storage media, and program instructions stored on the one or more computer readable storage media. Based at least in part on execution by a control system, the program instructions direct the control system to at least execute a performance test on a plurality of computing modules to determine at least power consumption for the plurality of computing modules, and sort the plurality of computing modules according to graduated power consumption levels. The program instructions direct the control system to at least establish an average power consumption for an assembly by at least selecting first computing modules from among the graduated power consumption levels having associated power consumption properties above a threshold level and selecting second computing modules from among the graduated power consumption levels having associated power consumption properties below the threshold level. The program instructions direct the control system to at least instruct assembly of the first computing modules upstream from the second computing modules with relation to an airflow direction in an enclosure associated with the circuit board assembly.

Example 19

The apparatus of Example 18, comprising further program instructions, based at least in part on execution by the control system, direct the control system to at least further establish the average power consumption for the assembly by at least selecting third computing modules from among the graduated power consumption levels having associated power consumption properties between the first computing modules and the second computing modules, and instruct assembly of the third computing modules between the first computing modules and the second computing modules with relation to the airflow direction.

Example 20

The apparatus of Examples 18-19, comprising further program instructions, based at least in part on execution by the control system, direct the control system to at least, for each of the plurality of computing modules, execute a performance test. The performance test iteratively boots a processing device of a target computing module into an operating system after reducing a voltage level of at least one supply voltage applied to at least one voltage domain of the target computing module. For each reduction in the at least one supply voltage, the performance test executes a voltage characterization service to perform one or more functional tests that run one or more application level processes in the operating system and exercise processor core elements and interface elements of the processing device in context with a plurality of elements external to the processing device on the target computing module which share the at least one supply voltage. The performance test monitors for operational failures of at least the processing device during execution of the voltage characterization service. Based at least on the operational failures, the performance test determines at least one resultant supply voltage, wherein the at least one resultant supply voltage relates to a power consumption level for the target computing module.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. A method comprising:
   executing a performance test on a plurality of computing modules to determine at least variability in power consumption across the plurality of computing modules;
   binning the plurality of computing modules according to graduated levels of the variability in power consumption; and
   selecting from among the graduated levels for placement in an assembly of ones of the computing modules in a progressively lower power consumption arrangement with relation to an airflow of the assembly.

2. The method of claim 1, wherein the variability in power consumption relates to predicted operating temperatures of the plurality of computing modules, and further comprising:
   selecting placement locations in the assembly for the ones of the computing modules based on the predicted operating temperatures to establish the progressively lower power consumption arrangement.

3. The method of claim 1, wherein determining at least the variability in power consumption comprises executing the performance test to determine minimum operating voltages lower than a manufacturer specified operating voltage for at least one supply voltage common to the plurality of computing modules.

4. The method of claim 1, further comprising:
   selecting from among the graduated levels to establish an average power consumption for the assembly below a threshold power level.

5. The method of claim 1, wherein a first graduated level in power consumption comprises power consumption below a power consumption threshold, and wherein a second graduated level in power consumption comprises power consumption above the power consumption threshold, and comprising:
   for first ones of the plurality of computing modules corresponding to the first graduated power level, placing into locations in the assembly further downstream in the airflow than second ones of the plurality of computing modules corresponding to the second graduated power level.

6. The method of claim 1, wherein a first graduated level in power consumption comprises power consumption below a first power consumption threshold, wherein a second graduated level in power consumption comprises power consumption above a second power consumption threshold, and wherein a third graduated level in power consumption comprises power consumption between the first power consumption threshold and the second power consumption threshold, and comprising:
- for first ones of the plurality of computing modules corresponding to the first graduated power level, placing into locations in the assembly further downstream in the airflow than third ones of the plurality of computing modules; and
- for the third ones of the plurality of computing modules, placing into locations in the assembly further downstream in the airflow than second ones of the plurality of computing modules corresponding to the second graduated power level.

7. The method of claim 1, wherein the performance test for each of the plurality of computing modules comprises:
- iteratively booting a processing device of a target computing module into an operating system after reducing a voltage level of at least one supply voltage applied to at least one voltage domain of the target computing module;
- for each reduction in the at least one supply voltage, executing a voltage characterization service to perform one or more functional tests that run one or more application level processes in the operating system and exercise processor core elements and interface elements of the processing device in context with a plurality of elements external to the processing device on the target computing module which share the at least one supply voltage;
- monitoring for operational failures of at least the processing device during execution of the voltage characterization service; and
- based at least on the operational failures, determining at least one resultant supply voltage, wherein the at least one resultant supply voltage relates to a power consumption for the target computing module.

8. The method of claim 7, wherein the iterative booting of the processing device comprises establishing a minimum operating voltage for the at least one supply voltage based on a current value of the iteratively reduced voltages, adding a voltage margin to the minimum operating voltage to establish the at least one resultant supply voltage, and instructing voltage regulator circuitry of the target computing module to supply the at least one resultant supply voltage to the processing device for operation of the processing device.

9. The method of claim 1, wherein the assembly comprises:
- an enclosure;
- at least one circuit board comprising connectors configured to couple to corresponding computing modules; and
- a fan assembly positioned at one end of the enclosure and configured to produce the airflow through the enclosure.

10. The method of claim 1, wherein each of the plurality of computing modules comprise a gaming system in a modular form factor configured to remotely service interactive gaming applications to end users over one or more network links.

11. An apparatus, comprising:
- a circuit board assembly;
- a fan assembly disposed proximate to a first end of the circuit board assembly; and
- a plurality of computing modules coupled to the circuit board assembly selected to achieve an average power consumption for the apparatus;
- wherein the plurality of computing modules are individually characterized for power consumption properties based on results of a performance test executed by each computing module; and
- wherein the plurality of computing modules are arranged on the circuit board assembly in a progressively lower power consumption arrangement with relation to an airflow of the fan assembly.

12. The apparatus of claim 11, wherein the plurality of computing modules are arranged on the circuit board assembly to locate first ones of the plurality of computing modules having power consumption levels above a threshold power consumption further upstream in the airflow than second ones of the plurality of computing module that have power consumption levels below the threshold power consumption.

13. The apparatus of claim 12, wherein third ones of the plurality of computing modules have power consumption levels between the first ones of the plurality of computing modules and the second ones of the plurality of computing modules; and
- wherein the plurality of computing modules are further arranged on the circuit board assembly to locate the third ones of the plurality of computing modules between the first ones of the plurality of computing modules and the second ones of the plurality of computing modules.

14. The apparatus of claim 11, wherein individually characterizing the power consumption comprises executing the performance test to determine minimum operating voltages lower than a manufacturer specified operating voltage for at least one supply voltage common to the plurality of computing modules.

15. The apparatus of claim 11, wherein the performance test for each of the plurality of computing modules comprises:
- iteratively booting a processing device of a target computing module into an operating system after reducing a voltage level of at least one supply voltage applied to at least one voltage domain of the target computing module;
- for each reduction in the at least one supply voltage, executing a voltage characterization service to perform one or more functional tests that run one or more application level processes in the operating system and exercise processor core elements and interface elements of the processing device in context with a plurality of elements external to the processing device on the target computing module which share the at least one supply voltage;
- monitoring for operational failures of at least the processing device during execution of the voltage characterization service; and
- based at least on the operational failures, determining at least one resultant supply voltage, wherein the at least one resultant supply voltage relates to a power consumption level for the target computing module.

16. The apparatus of claim 14, wherein the iterative booting of the processing device comprises establishing a minimum operating voltage for the at least one supply voltage based on a current value of the iteratively reduced voltages, adding a voltage margin to the minimum operating voltage to establish the at least one resultant supply voltage, and instructing voltage regulator circuitry of the target computing module to supply the at least one resultant supply voltage to the processing device for operation of the processing device.

17. The apparatus of claim 11, wherein each of the plurality of computing modules comprise a gaming system in a modular form factor configured to couple to the circuit board assembly and configured to remotely service interactive gaming applications to end users over one or more network links.

18. An apparatus comprising:
one or more computer readable storage media;
program instructions stored on the one or more computer readable storage media that, based at least in part on execution by a control system, direct the control system to at least:
execute a performance test on a plurality of computing modules to determine at least power consumption for the plurality of computing modules;
sort the plurality of computing modules according to graduated power consumption levels;
establish an average power consumption for an assembly by at least selecting first computing modules from among the graduated power consumption levels having associated power consumption properties above a threshold level and selecting second computing modules from among the graduated power consumption levels having associated power consumption properties below the threshold level; and
instruct assembly of the first computing modules upstream from the second computing modules with relation to an airflow direction in an enclosure associated with the circuit board assembly.

19. The apparatus of claim 18, comprising further program instructions, based at least in part on execution by the control system, direct the control system to at least:
further establish the average power consumption for the assembly by at least selecting third computing modules from among the graduated power consumption levels having associated power consumption properties between the first computing modules and the second computing modules; and
instruct assembly of the third computing modules between the first computing modules and the second computing modules with relation to the airflow direction.

20. The apparatus of claim 18, comprising further program instructions, based at least in part on execution by the control system, direct the control system to at least:
for each of the plurality of computing modules, execute the performance test to iteratively boot a processing device of a target computing module into an operating system after reducing a voltage level of at least one supply voltage applied to at least one voltage domain of the target computing module;
for each reduction in the at least one supply voltage, execute a voltage characterization service of the performance test to perform one or more functional tests that run one or more application level processes in the operating system and exercise processor core elements and interface elements of the processing device in context with a plurality of elements external to the processing device on the target computing module which share the at least one supply voltage;
monitor for operational failures of at least the processing device during execution of the voltage characterization service; and
based at least on the operational failures, determine at least one resultant supply voltage, wherein the at least one resultant supply voltage relates to a power consumption level for the target computing module.

\* \* \* \* \*